United States Patent
Le Rhun et al.

(10) Patent No.: US 11,262,246 B2
(45) Date of Patent: Mar. 1, 2022

(54) PYROELECTRIC DETECTION DEVICE WITH RIGID MEMBRANE

(71) Applicant: Commissariat A L'Energie Atomique et aux Energies Alternatives, Paris (FR)

(72) Inventors: Gwenael Le Rhun, Grenoble (FR); Stephane Fanget, Grenoble (FR); Andre Rouzaud, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 11 days.

(21) Appl. No.: 16/591,970

(22) Filed: Oct. 3, 2019

(65) Prior Publication Data

US 2020/0109992 A1 Apr. 9, 2020

(30) Foreign Application Priority Data

Oct. 5, 2018 (FR) ...................................... 18 59236

(51) Int. Cl.
| | |
|---|---|
| *G01J 5/34* | (2006.01) |
| *G01J 5/04* | (2006.01) |
| *H01L 37/02* | (2006.01) |

(52) U.S. Cl.
CPC ................. *G01J 5/34* (2013.01); *G01J 5/046* (2013.01); *H01L 37/02* (2013.01)

(58) Field of Classification Search
CPC .. G01J 5/34; G01J 5/046; G01J 5/0225; G01J 5/0285; G01J 5/044; H01L 37/02
See application file for complete search history.

(56) References Cited

U.S. PATENT DOCUMENTS

| | | | | |
|---|---|---|---|---|
| 4,032,783 A | * | 6/1977 | Koda ...................... | G01J 1/58 250/333 |
| 4,326,663 A | * | 4/1982 | Oettel ...................... | G01J 5/34 228/123.1 |

(Continued)

FOREIGN PATENT DOCUMENTS

| | | |
|---|---|---|
| DE | 20 2005 000 617 U1 | 5/2005 |
| WO | WO 2015/141496 A1 | 9/2015 |

OTHER PUBLICATIONS

French Preliminary Search Report dated Jul. 30, 2019 in French Application 18 59236 filed on Oct. 5, 2018 (with English Translation of Categories of Cited Documents).

(Continued)

*Primary Examiner* — Marcus H Taningco
(74) *Attorney, Agent, or Firm* — Oblon, McClelland, Maier & Neustadt, L.L.P.

(57) ABSTRACT

Pyroelectric detection device, including at least:
- a substrate;
- a membrane arranged on the substrate;
- a pyroelectric detection element arranged on the membrane or forming at least one part of the membrane, and including at least one portion of pyroelectric material arranged between first and second electrodes;
- a cavity passing through the substrate, emerging opposite a part of the membrane which forms a bottom wall of the cavity, and including side edges formed by the substrate;
- an element for stiffening the membrane arranged in the cavity, partially filling the cavity, made integral with the side edges of the cavity at at least two distinct anchoring regions, and arranged against the membrane.

20 Claims, 3 Drawing Sheets

(56) References Cited

U.S. PATENT DOCUMENTS

| | | | | |
|---|---|---|---|---|
| 7,820,970 | B1* | 10/2010 | Shaw | G01J 5/0821 |
| | | | | 250/338.1 |
| 2011/0182320 | A1 | 7/2011 | Noda | |
| 2012/0235038 | A1* | 9/2012 | Nishikawa | G01J 5/045 |
| | | | | 250/338.3 |
| 2014/0369382 | A1* | 12/2014 | Noda | G01J 5/02 |
| | | | | 374/121 |
| 2018/0333731 | A1* | 11/2018 | Orita | F42B 12/46 |

OTHER PUBLICATIONS

Qinqin, W, et al., "Low cost and anti-noise infrared device based on saw-tooth thermal isolation structure", Sensors and Actuators A; Physical, vol. 266, 2017, pp. 178-184.

Kohli, M, et al., "Pyroelectric thin-film sensor array", Sensors and Actuators A: Physical, vol. 60, issues 1-3, 1997, pp. 147-153.

Qiu-Lin, T, et al., "Design, fabrication and characterization of pyroelectric thin film and its application for infrared gas sensors", Microelectronics Journal, vol. 40, issue 1, 2009, pp. 58-62.

Whatmore, R., "Pyroelectric devices and materials", Rep. Prog. Phys. 49 (1986), 53 pages.

\* cited by examiner

PYROELECTRIC DETECTION DEVICE WITH RIGID MEMBRANE

TECHNICAL FIELD AND PRIOR ART

The invention relates to a pyroelectric detection device with rigid membrane, as well as a method for producing such a device. The invention advantageously applies to the infrared (IR) detection field, to carry out for example a detection of gas or to form an infrared imager serving for example to carry out a detection of movement or a detection of presence.

In a pyroelectric detection device such as an infrared detection device, an infrared radiation received by a pyroelectric material of the device induces a change in temperature of this material. This change in temperature leads to a variation in polarisation of the pyroelectric material, creating the circulation of an electric current through this material and making it possible to obtain, at the output of the device, a voltage.

The pyroelectric material has a spontaneous polarisation, of which the amplitude varies as a function of temperature. A variation in electrical charges may thus be measured when the intensity of the infrared flux received varies.

The production of such a pyroelectric detection device is based on technological methods conventionally used to manufacture MEMS (micro electro mechanical system) devices. The substrate generally used comprises silicon but other materials may be used (glass, sapphire, flexible polymer substrate, etc.).

In order to have good thermal insulation between the pyroelectric material and the substrate, and thereby limit losses by thermal conduction through the substrate, it is possible to etch the substrate to form a suspended membrane on which the pyroelectric material rests. The document "Pyroelectric thin film sensor array" of M. Kohli, Sensors and Actuators A: Physical, vol. 60, Issues 1-3, pages 147-153, May 1997, describes an infrared detection device thereby produced.

In the document "Design, fabrication and characterization of pyroelectric thin film and its application for infrared gas sensors" of T. Qiu-Lin et al, Microelectronics Journal, vol. 40, Issue 1, pages 58-62, January 2009, it is noted that a problem linked to this type of device including a pyroelectric material arranged on a suspended membrane resides in its sensitivity to mechanical stresses and vibrations because all pyroelectric materials are also piezoelectric. A parasitic current is thus generated in the pyroelectric material due to the mechanical stresses and vibrations undergone by the device on account of the piezoelectric properties of the pyroelectric material. The generation of such a parasitic current is called microphonic effect or microphony. The variations in ambient temperature and the luminosity to which the detector is exposed can also generate a parasitic signal which is superimposed on the output voltage signal of the detector corresponding to the measurement made.

A possible response to these problems, which is proposed in this document, is to produce, on the suspended membrane, two pyroelectric detection elements arranged side by side on the suspended membrane, forming two stacks each including a portion of pyroelectric material arranged between a front electrode and a rear electrode, of identical dimensions and electrically connected in series to each other by their front electrodes. In this configuration, the device is not very sensitive to common mode interferences such as the sensitivity to acceleration caused by the mechanical vibration, because the directions of polarisation induced in the two detection elements are opposite. Such a device thus makes it possible to improve the detection capacity. However, this improvement of detection capacity requires the production of two detection elements side by side, which is bulky and expensive to produce.

In the document "Pyroelectric devices and materials" of R. Whatmore, Rep. Prog. Phys. 49 (1986), pages 1335-1386, other solutions are also proposed for minimising the noise linked to this piezoelectric effect in infrared detection devices with pyroelectric material. Each of the different solutions proposed in this document has however at least one of the following drawbacks:
  need for a very rigid packaging in which the pyroelectric detector is arranged;
  need to use a compensation structure;
  need to suspend the detector on a polymer film which would tend to decouple the detector vis-à-vis deformations linked to the packaging;
  need to use a pyroelectric material having low piezoelectric coefficients.

DESCRIPTION OF THE INVENTION

Thus there is a need to propose a pyroelectric detection device making it possible to avoid or reduce the parasitic currents generated by microphonic effect and not having the drawbacks of the prior art described above.

To do so, a pyroelectric detection device is proposed, including at least:
  a substrate;
  a membrane arranged on the substrate;
  a pyroelectric detection element arranged on the membrane or forming at least one part of the membrane, and including at least one portion of pyroelectric material arranged between first and second electrodes;
  a cavity passing through, or extending through, the substrate, emerging opposite a part of the membrane which forms a bottom wall of the cavity, and including side edges formed by the substrate;
  an element for stiffening the membrane arranged in the cavity, partially filling the cavity, made integral with the side edges of the cavity at at least two distinct anchoring regions, and arranged against the membrane.

A pyroelectric membrane structure comprising piezoelectric material is thus proposed which makes it possible to reduce or even eliminate piezoelectric noise, that is to say the electrical charges generated by direct piezoelectric effect when the membrane vibrates (under the effect of a shock for example). To do so, it is proposed to stiffen the membrane thanks to a stiffening element arranged in the cavity and on which the membrane rests. This stiffening element makes it possible to reduce or to prevent the bending of the membrane when it is subjected to mechanical stresses or vibrations, which reduces or eliminates the parasitic currents generated. The electrical charges potentially generated by a shock are ideally zero or in any case very low or even negligible.

In addition, due to the fact that the stiffening element only partially fills the cavity, the space of the cavity not occupied by the stiffening element makes it possible to conserve good thermal insulation between the pyroelectric material and the substrate, and thereby limit losses by thermal conduction through the substrate.

The pyroelectric detection device may correspond to an infrared pyroelectric sensor, used for example to carry out a detection of gas, or an infrared imager.

The membrane, which includes for example one or more so-called elastic layer(s), enables the mechanical strength of the pyroelectric detection element.

The pyroelectric detection element forms a capacitor comprising pyroelectric material arranged between two electrodes.

Throughout the document, the term "on" is used without distinction of the orientation in space of the element to which this term relates. For example, in the characteristic "a pyroelectric detection element arranged on the membrane", the face of the membrane on which the pyroelectric detection element is arranged is not necessarily oriented upwards but may correspond to a face oriented along any direction. Moreover, the arrangement of a first element on a second element should be understood as being able to correspond to the arrangement of the first element directly against the second element, without any intermediate element between the first and second elements, or instead being able to correspond to the arrangement of the first element on the second element with one or more intermediate elements arranged between the first and second elements.

The pyroelectric detection device is for example of MEMS (micro electro mechanical system) or NEMS (nano electro mechanical system) type.

The membrane comprises one or more layers of materials.

Advantageously, the stiffening element may be formed at least by one or more portions of the substrate. In this case, this or these portions of material derived from the substrate may be formed for example by only releasing partially the membrane during a discontinuous etching of the substrate implemented during the production of the cavity.

The stiffening element may comprise several distinct portions of elongated shape and extending into the cavity between the side edges along one or more directions. Such a configuration is advantageous because it allows the production of the stiffening element according to geometries offering good mechanical maintaining of the membrane while conserving good thermal insulation between the pyroelectric material and the substrate.

A ratio between the surface area of the part of the membrane forming the bottom wall of the cavity which is in contact with the stiffening element and the total surface area of the part of the membrane forming the bottom wall of the cavity may be comprised between around 0.05 and 0.6. Such a configuration is advantageous because the stiffening element offers in this case a good compromise between good mechanical maintaining of the membrane and low thermal conduction by the stiffening element between the pyroelectric material and the substrate.

According to a first embodiment, the pyroelectric detection element may be arranged on the membrane which comprises at least one layer of material distinct from the pyroelectric detection element.

In this case, the layer of material of the membrane may comprise $SiO_2$ and/or Si and/or SiN.

According to a second embodiment, the membrane may form part of the pyroelectric detection element and may be formed at least by the first electrode on which the portion of piezoelectric material rests.

The pyroelectric detection element may comprise a black body formed by the second electrode which is configured to receive an incident infrared radiation intended to be detected by the device and/or by a portion of infrared radiation absorbing material such that the second electrode is arranged between the portion of infrared radiation absorbing material and the portion of pyroelectric material.

Thus, the second electrode may serve both as electrode and absorber of infrared radiation. The material of the second electrode may be different from that of the first electrode, and/or the thickness of the second electrode may be different from that of the first electrode, notably when the second electrode serves both as electrode and absorber of infrared radiation. For example, the first electrode may comprise platinum, and the second electrode may comprise a material configured so that the second electrode fulfils the functions of electrode and absorber of infrared radiation, such as for example Ni, Ni—Cr or TiN.

The black body corresponds to an element absorbing the electromagnetic energy received by the pyroelectric detection device.

The infrared radiation absorbing material may comprise TiN and/or Ni—Cr and/or Ni and/or black metal (black platinum, black gold, etc.).

The device may be such that:
the pyroelectric material corresponds to at least one of the following materials: PZT (lead zirconate titanate, or $Pb(Zr_x, Ti_{1-x})O_3$), doped PZT (Mn, La, Nb, etc.), AlN, KNN ($(K, Na)NbO_3$), NBT-BT ($(1-x)Na_{0.5}Bi_{0.5}TiO_3$-$xBaTiO_3$), PMN-PT ($Pb(Mg_{1/3}Nb_{2/3})O_3$—$PbTiO_3$), LTO (lithium tantalate, or $LiTaO_3$), LNO (lithium niobate, or $LiNbO_3$), PVDF, and/or
the first electrode comprises a metal (advantageously platinum, notably when the pyroelectric material comprises PZT because it makes it possible in this case to ensure good growth of the PZT material) and/or a metal oxide, and/or
the second electrode comprises at least one of the following materials: Pt, Ru, Ir, TiW, Au, Ni, Ni—Cr, TiN.

It is also proposed a method for producing a pyroelectric detection device, comprising at least:
producing, on a substrate, a membrane and a pyroelectric detection element such that it is arranged on the membrane or that it forms at least one part of the membrane, and including at least one portion of pyroelectric material arranged between first and second electrodes;
producing at least one cavity passing through the substrate, emerging opposite a part of the membrane which forms a bottom wall of the cavity, and including side edges formed by the substrate;
producing at least one element for stiffening the membrane arranged in the cavity, partially filling the cavity, made integral with the side edges of the cavity at at least two distinct anchoring regions, and arranged against the membrane.

Advantageously, the cavity and the stiffening element may be produced by a same etching step from a rear face of the substrate.

According to a first embodiment, the production of the membrane may comprise a step of producing, on the substrate, at least one layer of material intended to form the membrane and on which the pyroelectric detection element is next produced.

In this case, the layer of material may be produced by thermal oxidation of the substrate which comprises at least one semiconductor, and/or by deposition of $SiO_2$ on the substrate.

In addition, the production of the pyroelectric detection element may comprise the implementation of the following steps:
producing at least one first electrode layer on the layer of material;
producing at least one layer of pyroelectric material on the first electrode layer;

producing at least one second electrode layer on the layer of pyroelectric material;

structuring each of the first and second electrode layers and the layer of pyroelectric material such that remaining portions of these layers form the pyroelectric detection element.

According to a second embodiment, the suspended membrane may be obtained by the implementation of the following steps:

producing, on the substrate, at least one first electrode layer;

producing at least one layer of pyroelectric material on the first electrode layer;

producing at least one second electrode layer on the layer of pyroelectric material;

structuring the second electrode layer and the layer of pyroelectric material such that remaining portions of the second electrode layer and the layer of pyroelectric material form, with the first electrode layer, the pyroelectric detection element;

and in which the membrane may form part of the pyroelectric detection element and may be formed at least by the first electrode layer.

The method may further comprise, between the step of deposition of the second electrode layer and the structuring step, a step of deposition of at least one layer of infrared radiation absorbing material on the second electrode layer, and the structuring step may also be implemented for the layer of infrared radiation absorbing material such that a remaining portion of this layer of infrared radiation absorbing material arranged on the second electrode forms part of a black body of the pyroelectric detection element.

The second electrode layer may comprise a thickness and a material such that the second electrode forms part of the black body of the pyroelectric detection element.

BRIEF DESCRIPTION OF THE DRAWINGS

The present invention will be better understood on reading the description of exemplary embodiments given for purely illustrative purposes and in no way limiting while referring to the appended drawings in which.

Identical, similar or equivalent parts of the different figures described hereafter bear the same numerical references in order to make it easier to go from one figure to the next.

The different parts shown in the figures are not necessarily drawn according to uniform scale, in order to make the figures more legible.

The different possibilities (alternatives and embodiments) should be understood as not being mutually exclusive and may be combined together.

DETAILED DESCRIPTION OF PARTICULAR EMBODIMENTS

Figure 1:
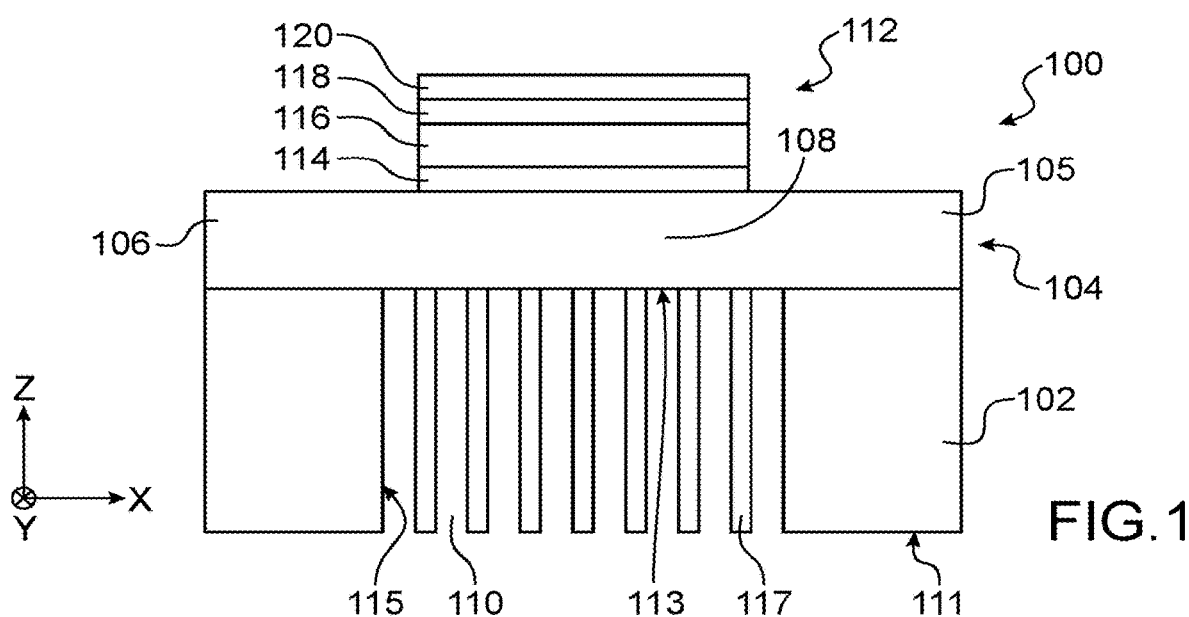
FIG. 1 shows a pyroelectric detection device according to a first embodiment.

Reference is made to FIG. 1 which shows a pyroelectric detection device 100 according to a first embodiment.

The device 100 comprises a substrate 102. The substrate 102 advantageously comprises semiconductor, for example silicon.

The device 100 also comprises a membrane 104. In the first embodiment described here, the membrane 104 comprises one or more so-called elastic layers 105 including at least one of the following materials: $SiO_2$, Si, SiN. The membrane 104 comprises edges 106, or ends, integral with the substrate 102, and a part 108 arranged opposite a cavity 110 formed through the substrate 102. For example, the membrane 104 may be formed by a layer 105 of $SiO_2$, or a $SiO_2$/SiN bilayer, of which the thickness is for example comprised between around 10 nm and 100 µm.

The cavity 110 passes through the substrate 102 from a rear face 111 of the substrate 102 and emerges opposite the part 108 of the membrane 104 which forms a bottom wall 113 of the cavity 110. The cavity 110 includes side edges 115 formed by the substrate 102.

In the configuration shown in FIG. 1, the membrane 104 is made integral with the substrate 102 at its edges 106. In an alternative, it is possible that the membrane 104 is made integral with the substrate 102 through arms for example formed by portions of material extending between certain parts of the membrane 104 and the substrate 102.

The device 100 also comprises a pyroelectric detection element 112 arranged on the membrane 104. The membrane 104 ensures the mechanical strength of the element 112. This element 112 comprises:

a lower electrode 114, also called first electrode;

a portion 116 of pyroelectric material;

an upper electrode 118, also called second electrode;

a portion 120 of infrared radiation absorbing material.

The lower electrode 114 is arranged on the membrane 104. The portion 116 of pyroelectric material is arranged between the lower and upper electrodes 114, 118. The portion 120 of infrared radiation absorbing material is arranged on the upper electrode 118.

The lower electrode 114 advantageously comprises platinum, which facilitates the growth of the pyroelectric material of the portion 116 during its production. The upper electrode 118 comprises for example at least one of the following materials: Pt, Ru, Ir, TiW, Au. Each of the lower 114 and upper 118 electrodes has a thickness for example comprised between around 2 nm and 200 nm. Although not shown, an adhesion layer may be arranged between the membrane 104 and the lower electrode 114. This adhesion layer includes for example $TiO_2$ or any other suitable material so that the lower electrode 114 adheres well to the membrane 104, and has for example a thickness comprised between around 2 nm and 40 nm.

The portion 116 of pyroelectric material advantageously comprises PZT, but may comprise more generally at least one of the following materials: PZT, AlN, KNN, NBT-BT, PMN-PT, LTO, LNO, PVDF. The PZT may be doped, for example with Nb, Mn or La. The thickness of the portion 116 of pyroelectric material is for example comprised between around 50 nm and 2 µm.

The portion 120 of absorbing material comprises at least one of the following materials: TiN and/or Ni—Cr and/or Ni and/or black metal (black platinum, black gold, etc.). The thickness of the portion 120 is for example comprised between around 1 nm and 5 µm.

Since the pyroelectric material of the portion 116 is also piezoelectric, it can generate charges by direct piezoelectric effect, for example under the effect of a mechanical stress, a shock, or even during a change in temperature leading to a deformation of this material. These charges can interfere with the operation of a pyroelectric detection element because they are added to the charges generated by the pyroelectric effect during the detection of an incident radiation by this element.

To eliminate these parasitic charges, or at least to reduce them, the device 100 also comprises an element 117 for stiffening the membrane 104. This element 117 is arranged in the cavity 110 and partially fills the cavity 110. This element 117 is made integral with the side edges 115 of the cavity 110 at at least two distinct anchoring regions. Moreover, this element 117 is arranged against the membrane 104, that is to say that the membrane 104 rests on this element 117.

Advantageously, the element 117 comprises portions of the substrate 102 that have not been etched during the production of the cavity 110.

Advantageously, each of the portions of material forming the element 117 has an elongated shape and extends into the cavity 110 between the side edges 115.

Each of these portions has for example a blade or fin shape.

Figure 2:
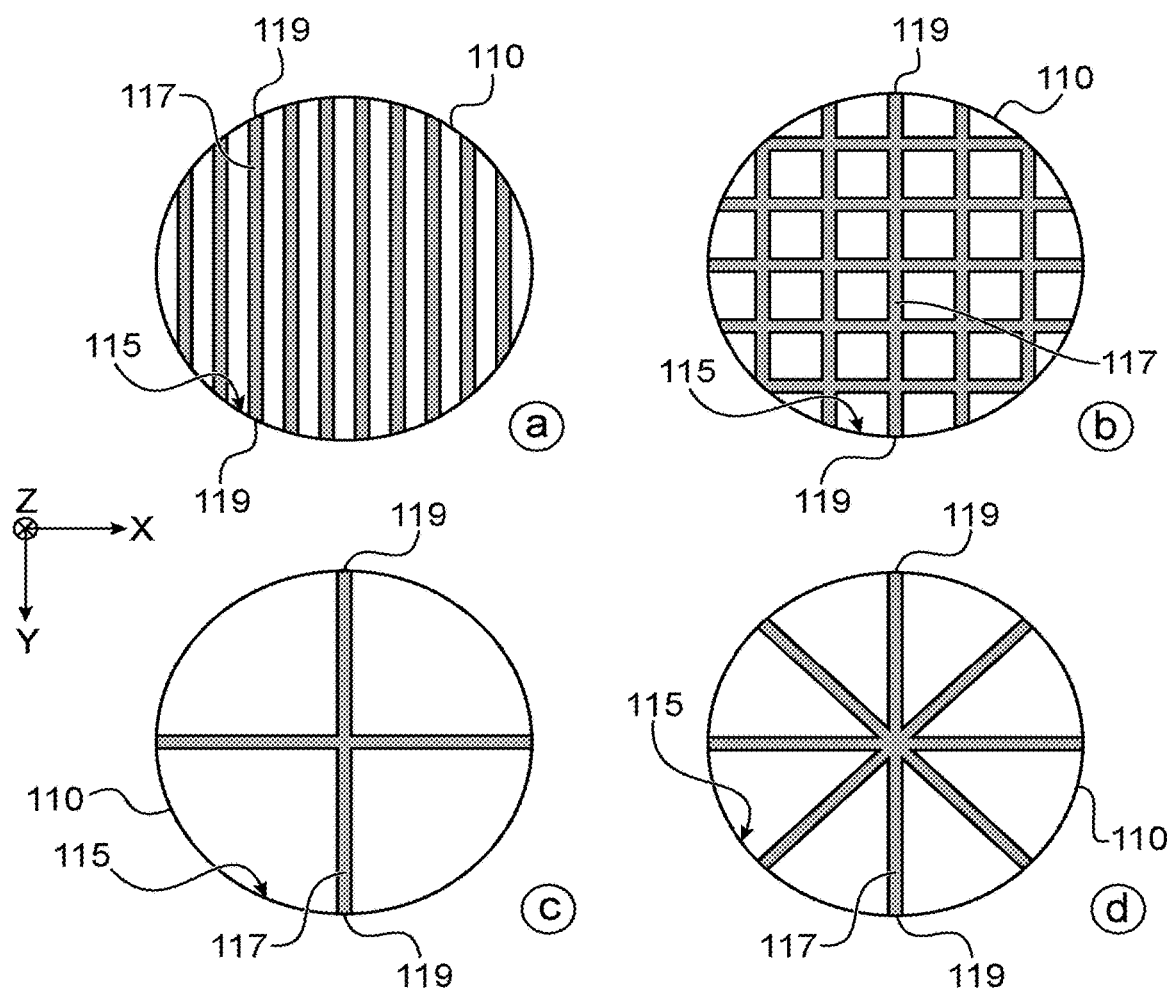
FIG. 2 shows several exemplary embodiments of the stiffening element of a pyroelectric detection device according to a particular embodiment.

Different exemplary embodiments of the stiffening element 117 are shown in FIG. 2.

In the exemplary embodiment referenced a) of FIG. 2, the stiffening element 117 comprises several portions of material arranged in the cavity 110, each having an elongated shape and being made integral with the side edges 115 of the cavity 110 at two distinct anchoring points 119. In this exemplary embodiment, the portions of material of the element 117 extend along a same direction, that is to say correspond to portions of elongated shape arranged parallel to each other (parallel to the axis Y in FIG. 2).

In the exemplary embodiment referenced b) of FIG. 2, the stiffening element 117 comprises several portions of material arranged in the cavity 110, each having an elongated shape and being made integral with the side edges 115 of the cavity 110 at two distinct anchoring points 119. In this exemplary embodiment, the portions of material of the element 117 extend along two directions perpendicular to each other (each parallel with one of the axes X and Y in FIG. 2). In this exemplary embodiment, the portions of material of the element 117 form a grid-shaped rigid assembly and anchored to the side edges 115 of the cavity 110 and on which the membrane 104 rests.

In the exemplary embodiment referenced c) of FIG. 2, the stiffening element 117 comprises two portions of material arranged in the cavity 110, each having an elongated shape and being made integral with the side edges 115 of the cavity 110 at two distinct anchoring points 119. In this exemplary embodiment, one of these two portions extends along a first direction (parallel to one of the axes X and Y in FIG. 2), and the other extends along a second direction perpendicular to the first direction (parallel to the other of the axes X and Y in FIG. 2). In this exemplary embodiment, the portions of material of the element 117 form a cross-shaped rigid assembly comprising its four ends made integral with the side edges 115 of the cavity 110 and on which the membrane 104 rests.

In the exemplary embodiment referenced d) of FIG. 2, the stiffening element 117 comprise three portions of material arranged in the cavity 110, each having an elongated shape and being made integral with the side edges 115 of the cavity 110 at two distinct anchoring points 119. In this exemplary embodiment, the portions of material of the element 117 extend along different directions in such a way as to form a rigid star-shaped assembly comprising its ends made integral with the side edges 115 of the cavity 110 and on which the membrane 104 rests.

In an alternative, the stiffening element 117 may be produced differently from the examples described above.

Whatever the shape, the number and the arrangement of the portion(s) of material forming the stiffening element 117 in the cavity 110, this or these portions of material are advantageously produced such that the stiffening element 117 ensures sufficient mechanical maintaining of the membrane 104, while limiting the surface areas of contact with the membrane 104 in order to conserve good thermal insulation of the membrane 104 vis-à-vis the substrate 102. To obtain such a compromise, the ratio between the surface area of the part of the membrane forming the bottom wall 113 of the cavity 110 which is in contact with the stiffening element 117 and the total surface area of the part 108 of the membrane 104 forming the bottom wall 113 of the cavity 110 is advantageously comprised between around 0.05 and 0.6.

An example of a method for producing the device 100 is described below in relation with FIGS. 3 and 4.

Figure 3:
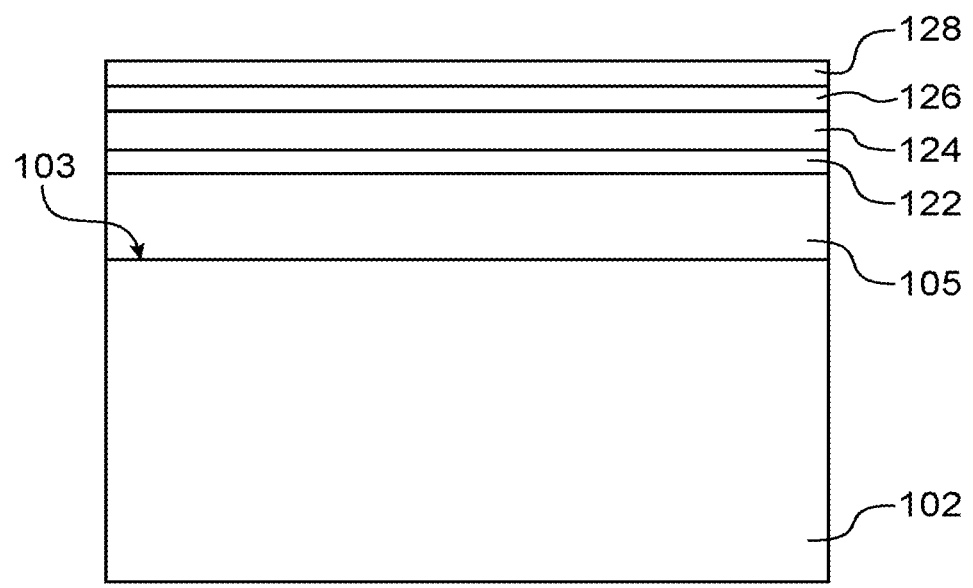
FIGS. 3 and 4 show the steps of a method for producing a pyroelectric detection device according to the first embodiment.

As shown in FIG. 3, one (or several) layer(s) 105 of material intended to form the suspended membrane is produced on a front face 103 of the substrate 102. In the exemplary embodiment described here, the substrate 102 comprises silicon and the layer 105 comprises $SiO_2$. According to a first example, the layer 105 may be produced by thermal oxidation from the front face 103 of the substrate 102. According to a second example, the layer 105 may be formed by a deposition, for example PECVD (plasma enhanced chemical vapour deposition), of $SiO_2$, advantageously followed by a densification corresponding for example to an annealing in an oven under oxygen, at a temperature for example equal to around 800° C. and for a duration equal to around 3 hours.

At least one first electrode layer 122 intended to form the lower electrode 114 is next deposited on the layer 105. In the exemplary embodiment described here, the first electrode layer 122 comprises platinum. Advantageously, the deposition of this first electrode layer 122 is preceded by a deposition of a seed layer (not shown in FIG. 3) corresponding for example to a layer of $TiO_2$ deposited on the layer 105, the first electrode layer 122 next being deposited on this seed layer.

At least one layer 124 of pyroelectric material intended to form the portion 116 of pyroelectric material is next deposited on the first electrode layer 122. This layer 124 is for example formed by a sol-gel type method or by cathodic sputtering or instead by pulsed laser ablation.

At least one second electrode layer 126, including for example platinum, intended to form the upper electrode 118 is next deposited on the layer 124.

A layer 128 of infrared radiation absorbing material intended to form the portion 120 is next deposited on the second electrode layer 126.

Figure 4:
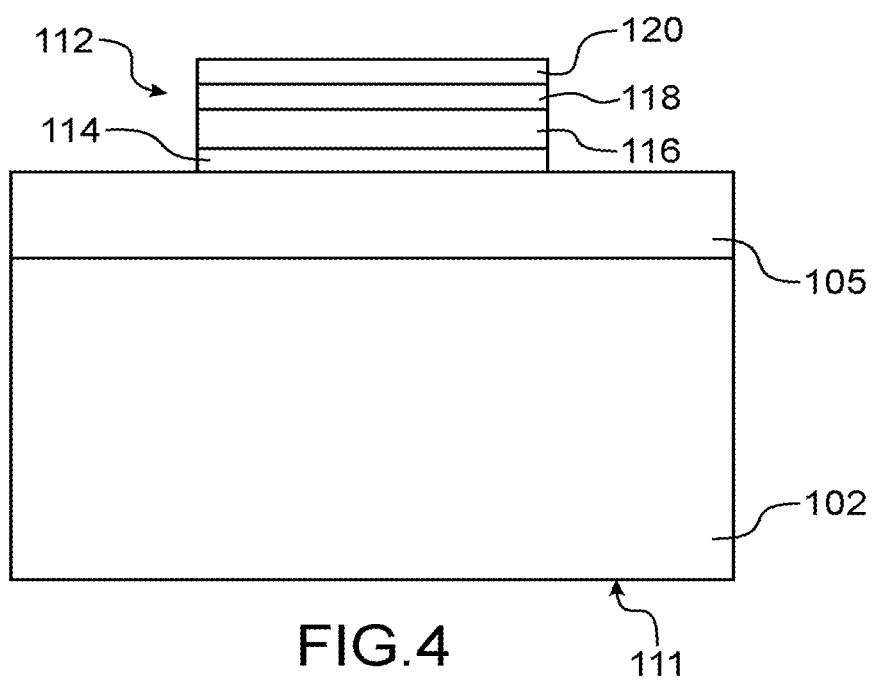

A structuring of each of the layers 122, 124, 126 and 128 is next implemented, for example by lithography, etching and stripping, such that the remaining portions 114, 116, 118 and 120 of these layers form the pyroelectric detection element 112 (see FIG. 4).

An etching is next implemented from the rear face 111 of the substrate 102 in order to form the cavity 110 and the stiffening element 117. This etching corresponds for example to a deep reactive ion etching (DRIE). The material of the substrate 102 located in the region delimited by the side edges 115 of the cavity 110 is etched in a discontinuous manner in order to conserve portions of material of the substrate 102 to form the stiffening element 117. The membrane 104 is thus only partially released by the implementation of this etching.

The device 100 obtained at the end of this method corresponds to that shown in FIG. 1.

In the first embodiment shown in FIG. 1, the width (dimension along the X axis shown in FIG. 1), or the diameter, of the element 112 is less than that of the cavity 110. The edges of the element 112 do not rest on the substrate 102 and are arranged opposite the cavity 110 and not the parts of the substrate 102 located around the cavity 110. This configuration is advantageous because it makes it possible to improve the thermal insulation of the element 112 vis-à-vis the substrate 102.

In an alternative, it is however possible that the width, or the diameter, of the element 112 is greater than that of the cavity 110. In this case, the edges of the element 112 rest on the parts of the substrate 102 surrounding the cavity 110.

In the first embodiment described previously, the device 100 comprises an absorbing element formed by the portion 120. In an alternative, it is possible that the upper electrode 118 serves as infrared radiation absorbing element. In this case, the upper electrode 118 advantageously comprises Ni and/or NiCr and/or TiN.

Figure 5:
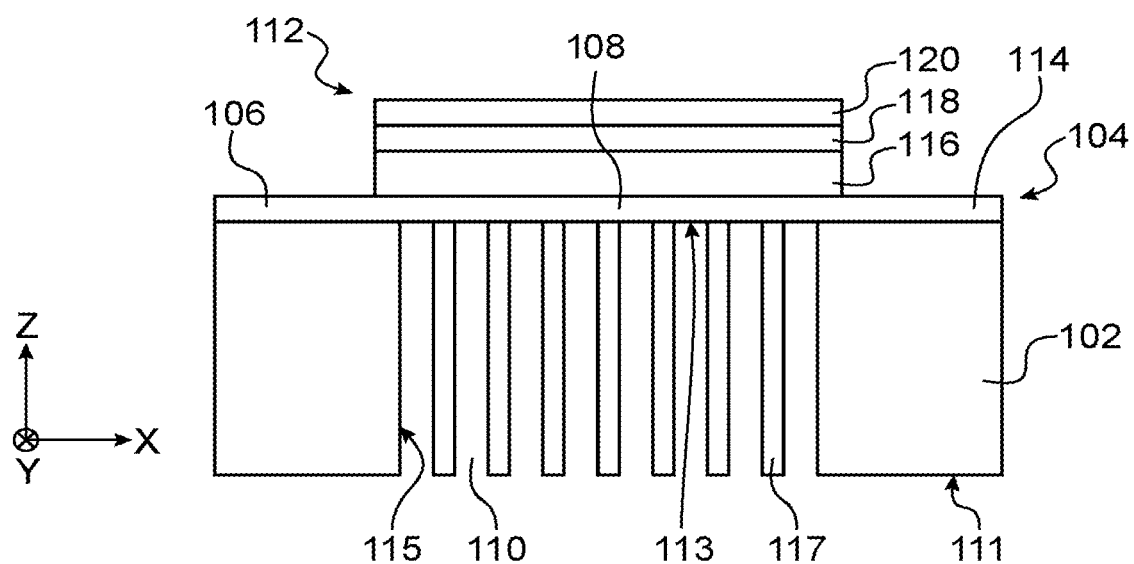
FIG. 5 shows a pyroelectric detection device according to a second embodiment.

A pyroelectric detection device 100 according to a second embodiment is described below in relation with FIG. 5.

Compared to the device 100 according to the first embodiment described previously, the device 100 according to the second embodiment does not comprise the layer 105 serving to form the membrane 104. In this second embodiment, the layer forming the lower electrode 114 also forms the membrane 104. In an alternative, it is possible that other parts of the element 112 (portion 116 and/or upper electrode 118) form the membrane 104.

As in the first embodiment, one or more elements 117 for stiffening the membrane 104 are arranged in the cavity 110.

The different alternatives described previously in relation with the first embodiment may apply to this second embodiment.

In the exemplary embodiments described previously, the stiffening element 117 comprises portions of material derived from the substrate 102 and obtained during the production of the cavity 110 by partially etching the material of the substrate 102 located in the volume of the cavity 110 in order that the remaining non-etched portion(s) form the portion(s) of material of the stiffening element. In an alternative, it is possible that the stiffening element 117 comprises portions of material that are not derived from the substrate 102 but which are produced in the cavity 110 after having totally etched the material of the substrate 102 located in the volume of the cavity 110. In this case, the cavity 110 may be filled by material, for example different from that of the substrate 102, which is next shaped by lithography and etching steps to form the stiffening element 117. This material may be chosen as a function of its thermal conduction depending on whether it is wished to favour insulation (by choosing in this case for example a polymer or $SiO_2$) or thermal conduction (by choosing in this case for example silicon).

In the embodiments of the device 100 described previously, the thickness (dimension parallel to the axis Z in FIGS. 1 to 5) of the stiffening element 117 is equal to the thickness of the substrate 102, for example equal to 725 μm for a standard substrate of 200 mm diameter. In an alternative, it is possible that the thickness of the stiffening element 117 is less than the initial thickness of the substrate 102, for example when a thinning is implemented from the rear face 111 of the substrate 102 or when the etching implemented to form the cavity 110 also etches a part of the thickness of the material of the stiffening element 117. It is also possible that the different portions of material forming the stiffening element 117 do not have the same thicknesses with respect to each other.

The invention claimed is:

1. A pyroelectric detection device, comprising:
a substrate;
a membrane arranged on the substrate;
a pyroelectric detection element arranged on the membrane or forming at least one part of the membrane, and including at least one portion of pyroelectric material arranged between first and second electrodes;
a cavity passing through the substrate, emerging opposite a part of the membrane which forms a bottom wall of the cavity, and including side edges formed by the substrate;
an element for stiffening the membrane arranged in the cavity, partially filling the cavity, made integral with the side edges of the cavity at at least two distinct anchoring regions, and arranged against the membrane, wherein the stiffening element is formed by one or more portions of the substrate such that the stiffening element and the substrate are made of a same material,
in which a ratio between the surface area of the part of the membrane forming the bottom wall of the cavity which is in contact with the stiffening element and the total surface area of the part of the membrane forming the bottom wall of the cavity is comprised between around 0.05 and 0.6.

2. The pyroelectric detection device according to claim 1, in which the stiffening element comprises several distinct portions of elongated shape and extending into the cavity between the side edges along one or more directions.

3. The pyroelectric detection device according to claim 1, in which the pyroelectric detection element is arranged on the membrane which comprises at least one layer of material distinct from the pyroelectric detection element.

4. The pyroelectric detection device according to claim 3, in which the layer of material of the membrane comprises at least one of the following materials: $SiO_2$, Si, SiN.

5. The pyroelectric detection device according to claim 1, in which the membrane forms part of the pyroelectric detection element and is formed at least by the first electrode on which the at least one portion of pyroelectric material rests.

6. The pyroelectric detection device according to claim 1, in which the pyroelectric detection element comprises a black body formed by at least one of the second electrode which is configured to receive an incident infrared radiation intended to be detected by the device and of a portion of infrared radiation absorbing material such that the second electrode is arranged between the portion of infrared radiation absorbing material and the portion of pyroelectric material.

7. The pyroelectric detection device according to claim 6, in which the infrared radiation absorbing material comprises at least one of the following materials: TiN, Ni—Cr, Ni, black metal.

8. The pyroelectric detection device according to claim 7, in which the material of the stiffening element is different from the layer of the infrared radiation absorbing material.

9. The pyroelectric detection device according to claim 1, in which:
- the pyroelectric material corresponds to at least one of the following materials: PZT, doped PZT, AlN, KNN, NBT-BT, PMN-PT, LTO, LNO, PVDF, or
- the first electrode comprises at least one of a metal and of a metal oxide, or
- the second electrode comprises at least one of the following materials: Pt, Ru, Ir, TiW, Au, Ni, Ni—Cr, TiN.

10. The pyroelectric detection device according to claim 1, in which a height of the stiffening element is equal to a height of the substrate surrounding the cavity.

11. The pyroelectric detection device according to claim 1, in which the portions of the substrate that form the stiffening element includes a first set of parallel portions extending in a first direction, each end of the first set of parallel portions being integral with the side edges of the cavity, and a second set of parallel portions extending in a second direction that is perpendicular to the first direction, each end of the second set of parallel portions being integral with the side edges of the cavity.

12. A method for producing a pyroelectric detection device, comprising:
- producing, on a substrate, a membrane and a pyroelectric detection element such that it is arranged on the membrane or that it forms at least one part of the membrane, and including at least one portion of pyroelectric material arranged between first and second electrodes;
- producing at least one cavity passing through the substrate, emerging opposite a part of the membrane which forms a bottom wall of the cavity, and including side edges formed by the substrate;
- producing at least one element for stiffening the membrane arranged in the cavity, partially filling the cavity, made integral with the side edges of the cavity at at least two distinct anchoring regions, and arranged against the membrane,
- wherein the stiffening element is formed by one or more portions of the substrate such that the stiffening element and the substrate are made of a same material, and
- wherein a ratio between the surface area of the part of the membrane forming the bottom wall of the cavity which is in contact with the stiffening element and the total surface area of the part of the membrane forming the bottom wall of the cavity is comprised between around 0.05 and 0.6.

13. The method according to claim 12, in which the cavity and the stiffening element are produced by a same etching step from a rear face of the substrate.

14. The method according to claim 12, in which the production of the membrane comprises a step of producing, on the substrate, at least one layer of material intended to form the membrane and on which the pyroelectric detection element is next produced.

15. The method according to claim 14, in which the layer of material is produced by at least one of a thermal oxidation of the substrate which comprises at least one semiconductor, and of a deposition of $SiO_2$ on the substrate.

16. The method according to claim 14, in which the production of the pyroelectric detection element comprises the implementation of the following steps:
- producing at least one first electrode layer on the layer of material;
- producing at least one layer of pyroelectric material on the first electrode layer;
- producing at least one second electrode layer on the layer of pyroelectric material;
- structuring each of the first and second electrode layers and the layer of pyroelectric material such that remaining portions of these layers form the pyroelectric detection element.

17. The method according to claim 16, further comprising, between the step of deposition of the second electrode layer and the structuring step, a step of deposition of at least one layer of infrared radiation absorbing material on the second electrode layer, and in which the structuring step is also implemented for the layer of infrared radiation absorbing material such that a remaining portion of this layer of infrared radiation absorbing material arranged on the second electrode forms part of a black body of the pyroelectric detection element.

18. The method according to claim 17, in which the material of the stiffening element is different from the layer of the infrared radiation absorbing material.

19. The method according to claim 12, in which the membrane is obtained by the implementation of the following steps:
- producing, on the substrate, at least one first electrode layer;
- producing at least one layer of pyroelectric material on the first electrode layer;
- producing at least one second electrode layer on the layer of pyroelectric material;
- structuring the second electrode layer and the layer of pyroelectric material such that remaining portions of the second electrode layer and the layer of pyroelectric material form, with the first electrode layer, the pyroelectric detection element;
- and in which the membrane forms part of the pyroelectric detection element and is formed at least by the first electrode layer.

20. The method according to claim 12, in which a height of the stiffening element is equal to a height of the substrate surrounding the cavity.

* * * * *